(12) United States Patent
Kawasaki et al.

(10) Patent No.: US 11,819,955 B2
(45) Date of Patent: *Nov. 21, 2023

(54) SOLDER ALLOY, SOLDER PASTE, SOLDER BALL, SOLDER PREFORM, SOLDER JOINT, ON-BOARD ELECTRONIC CIRCUIT, ECU ELECTRONIC CIRCUIT, ON-BOARD ELECTRONIC CIRCUIT DEVICE, AND ECU ELECTRONIC CIRCUIT DEVICE

(71) Applicant: SENJU METAL INDUSTRY CO., LTD., Tokyo (JP)

(72) Inventors: Hiroyoshi Kawasaki, Tokyo (JP); Masato Shiratori, Tokyo (JP); Yuji Kawamata, Tokyo (JP)

(73) Assignee: SENJU METAL INDUSTRY CO., LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/614,199

(22) PCT Filed: May 21, 2020

(86) PCT No.: PCT/JP2020/020064
§ 371 (c)(1),
(2) Date: Nov. 24, 2021

(87) PCT Pub. No.: WO2020/241437
PCT Pub. Date: Dec. 3, 2020

(65) Prior Publication Data
US 2022/0250194 A1    Aug. 11, 2022

(30) Foreign Application Priority Data

May 27, 2019  (JP) ................................ 2019-098946

(51) Int. Cl.
  *B23K 35/26*  (2006.01)
  *C22C 13/00*  (2006.01)
  *B23K 35/02*  (2006.01)

(52) U.S. Cl.
  CPC .......... *B23K 35/262* (2013.01); *B23K 35/025* (2013.01); *C22C 13/00* (2013.01)

(58) Field of Classification Search
  CPC ................................................ B23K 35/262
  See application file for complete search history.

(56) References Cited

U.S. PATENT DOCUMENTS 11,377,715 B2 *  7/2022  Kawasaki .............. B23K 35/26
2007/0036671 A1  2/2007  Albrecht et al.
(Continued)

FOREIGN PATENT DOCUMENTS

CN    101479073    7/2009
CN    103501959    1/2014
(Continued)

OTHER PUBLICATIONS

Le, Van Nhat et al., "Finite Element analysis of the effect of process-induced voids on the fatigue lifetime of a lead-free solder joint under thermal cycling," *Microelectronics Reliability*, vol. 65, 2016, pp. 243-254.
(Continued)

*Primary Examiner* — Devang R Patel
(74) *Attorney, Agent, or Firm* — NIXON PEABODY LLP; Jeffrey L. Costellia

(57) ABSTRACT

A solder alloy is provided which can withstand the severe characteristics of a temperature cycle between a low temperature of −40° C. and a high temperature of 125° C., withstand an external force applied due to, for example, riding on a curb or collision with a vehicle ahead for a long period of time, and can suppress change in viscosity of a
(Continued)

solder paste over time. In addition, a solder paste, a solder ball, and a solder preform in which the solder alloy is used; a solder joint formed through the use thereof; and an on-board electronic circuit, an ECU electronic circuit, an on-board electronic circuit device, and an ECU electronic circuit device which include this solder joint are provided. The solder alloy contains, by mass %, 1% to 4% of Ag, 0.5% to 1.0% of Cu, 1.5% to 5.5% of Bi, 1.0% to 5.3% of Sb (or greater than 5.5% and less than or equal to 7.0% of Bi and 2.0% to 5.3% of Sb), 0.01% to 0.2% of Ni, 0.0040% to 0.0250% of As, and a balance of Sn.

13 Claims, 2 Drawing Sheets

(56) References Cited

U.S. PATENT DOCUMENTS

| | | | |
|---|---|---|---|
| 2010/0294565 | A1 | 11/2010 | Kawamata et al. |
| 2015/0136461 | A1 | 5/2015 | Imamura et al. |
| 2015/0305167 | A1* | 10/2015 | Nakanishi ............ H05K 3/3485 174/257 |
| 2016/0056570 | A1 | 2/2016 | Yoshikawa et al. |
| 2016/0271738 | A1* | 9/2016 | Murphy .................... B23K 1/00 |
| 2022/0088721 | A1* | 3/2022 | Kawasaki ................ C22C 13/00 |
| 2022/0088723 | A1* | 3/2022 | Kawasaki .............. B23K 35/26 |

FOREIGN PATENT DOCUMENTS

| | | | |
|---|---|---|---|
| CN | 104395035 | | 3/2015 |
| CN | 106794557 | | 5/2017 |
| CN | 107427969 | | 12/2017 |
| EP | 3321025 | | 5/2018 |
| JP | 05050286 A | * | 3/1993 |
| JP | 05-228685 | | 9/1993 |
| JP | 09-326554 | | 12/1997 |
| JP | 2000-349433 | | 12/2000 |
| JP | 2002224881 A | * | 8/2002 |
| JP | 2006-524572 | | 11/2006 |
| JP | 2014-024082 | | 2/2014 |
| JP | 2015-098052 | | 5/2015 |
| JP | 2015098052 A | * | 5/2015 |
| JP | 5807733 | | 11/2015 |
| JP | 2016-537206 | | 12/2016 |
| WO | WO-2009/011341 | | 1/2009 |
| WO | WO-2014/003006 | | 1/2014 |
| WO | WO-2014/163167 | | 10/2014 |
| WO | WO-2015/066155 | | 5/2015 |
| WO | WO-2017/164194 | | 9/2017 |
| WO | WO-2017/192517 | | 11/2017 |
| WO | WO-2019-103025 | | 5/2019 |

OTHER PUBLICATIONS

International Search Report for Application No. PCT/JP2020/020064, dated Aug. 18, 2020, 4 pages.
Chinese Search Report (Application No. 202080014645.4) dated Feb. 8, 2022 (8pages).
International Search Report (App. No. PCT/JP2020/019502) dated Aug. 4, 2020 (4pages).
U.S. Office Action (U.S. Appl. No. 17/603,419) dated Feb. 4, 2022 (10 pages).
Chinese Search Report (Application No. 202080038798.2) dated Aug. 3, 2022 (total 7 pages).
Van-Nhat Le et al., "Modeling of intergranular thermal fatigue cracking of a lead-free solder joint in a power electronic module", International Journal of Solids and Structures, vol. 106, Dec. 6, 2016, pp. 1-12.
Supplementary European Search Report for European App. No. 20813014.6, dated Jun. 26, 2023 (12 pages).

* cited by examiner

SOLDER ALLOY, SOLDER PASTE, SOLDER BALL, SOLDER PREFORM, SOLDER JOINT, ON-BOARD ELECTRONIC CIRCUIT, ECU ELECTRONIC CIRCUIT, ON-BOARD ELECTRONIC CIRCUIT DEVICE, AND ECU ELECTRONIC CIRCUIT DEVICE

TECHNICAL FIELD

The present invention relates to a solder alloy, a solder paste, a solder ball, a solder preform, a solder joint, an on-board electronic circuit, an ECU electronic circuit, an on-board electronic circuit device, and an ECU electronic circuit device.

BACKGROUND ART

An electronic circuit (hereinafter, referred to as an on-board electronic circuit) obtained by soldering electronic components onto a printed board is mounted on a vehicle. On-board electronic circuits are used in devices that electrically control engines, power steering, brakes, and the like and are significantly important safety components for vehicles travelling. In particular, an on-board electronic circuit called an engine control unit (ECU) which is an electronic circuit that controls a vehicle with a computer to improve fuel economy has to be able to operate in a stable state without failures for a long period of time. In many cases, these ECUs are generally installed near engines, and the usage environment is that of quite severe conditions.

The temperature in the vicinity of an engine in which such on-board electronic circuits are installed is as high as 125° C. or higher during rotation of the engine. On the other hand, when the rotation of the engine is stopped, the outside air temperature is as low as −40° C. or lower in winter in cold regions, such as, for example, North America or Siberia. Accordingly, on-board electronic circuits are exposed to a heat cycle between −40° C. and +125° C. due to repetition of operation and stopping of engines.

If an on-board electronic circuit is exposed to such an environment where the temperature changes significantly over a long period of time, thermal expansion and contraction are caused in electronic components and printed boards. However, since the difference in linear thermal expansion coefficient between an electronic component and a printed board is large and a constant thermal displacement occurs in a soldering portion (hereinafter, referred to as a "solder joint") at which the electronic component is joined to the printed board during use in the above-described environment, stress is repeatedly applied thereto due to temperature changes. Then, a joint interface or the like of a solder joint portion finally breaks due to the application of stress to the solder joint. In electronic circuits, it is also thought that, even if a solder joint does not completely break, when cracks occur in the solder joint portion at a crack rate of 99% or less, electronic circuits may malfunction due to an increase in resistance values of the circuits even in an electrically conductive state. The occurrence of a malfunction in an on-board electronic circuit, particularly an ECU, due to cracks occurring in a solder joint may lead to a serious vehicle accident fatal to human life. In this manner, the temperature cycle characteristics are particularly important for on-board electronic circuits, particularly ECUs, and the strictest conceivable temperature conditions are required.

An on-board lead-free solder or the like containing 2.8 to 4 mass % of Ag, 1.5 to 6 mass % of Bi, 0.8 to 1.2 mass % of Cu, at least one selected from the group consisting of Ni, Fe, and Co in a total amount of 0.005 to 0.05 mass %, and a balance of Sn is disclosed in Patent Document 1 as a solder alloy capable of withstanding such severe temperature conditions.

In addition, a solder substance containing, as a solder alloy with a usable temperature of higher than or equal to 150° C., an alloy which contains 10 weight % or less of Ag, 10 weight % or less of Bi, 10 weight % or less of Sb, and 3 weight % or less of Cu in addition to Sn as a main component, and further contains 1.0 weight % or less of Ni is disclosed in Patent Document 2.

CITATION LIST

Patent Literature

[Patent Document 1]
WO2009/011341A
[Patent Document 2]
Published Japanese Translation No. 2006-524572 of the PCT International Publication

SUMMARY OF INVENTION

Technical Problem

As can be seen in the spreading of hybrid or electric vehicles, the transition from mechanical components to electronic components in vehicles is progressing. Along with this, miniaturization of electronic circuits for vehicles which are previously large in size is required. In the related art, on-board electronic circuits which have been soldered through flow soldering after reflow soldering are used. However, in recent years, double-sided reflow boards of which both surfaces are surface-mounted with a solder paste have been used. Due to the high density of such on-board electronic circuits, failures including new manners of cracking in which cracks propagate within Sn phase grains have appeared in a severe environment as well as cracks occurring at Sn boundaries or between different phases as in the related art.

Incidentally, Patent Document 1 discloses a solder alloy having long service life in a severe environment. However, since vehicles are used as transportation means, vehicles are rarely left in one place and often used on roads and the like. When vehicles are used on such roads, vibration is applied to on-board electronic circuit devices at all times due to rough roads and, in many cases, an external force is applied to on-board electronic circuit devices due to, for example, riding over curbs or collision with a vehicle ahead. The entire on-board electronic circuit device is often replaced in a serious accident due to collision with a vehicle. However, in many cases, only the exterior of a vehicle is replaced after a minor collision. Therefore, on-board electronic circuit devices are required to not only withstand severe environments but also external forces which are applied.

In addition, the solder alloy disclosed in Patent Document 2 excludes Co from the solder alloy disclosed in Patent Document 1 and contains Sb. The ranges for the amount of constituent elements thereof are much wider than the ranges for the amount of those of the solder alloy disclosed in Patent Document 1. The solder alloy disclosed in Patent Document 2 is intended to be usable at a high temperature, and constituent elements thereof are different from those of the solder alloy of Patent Document 1. For this reason, it is doubtful whether or not the solder alloy disclosed in Patent Document 2 would be able to withstand a severe environment similarly to the solder alloy disclosed in Patent Document 1 in the entire range of the amount disclosed in Patent Document 2. It is necessary to reexamine the alloy composition to obtain favorable temperature cycle characteristics.

Furthermore, in joining and assembling of electronic components to boards, soldering using a solder paste is advantageous in terms of costs and reliability. Coating of a board with a solder paste is performed, for example, through screen printing using a metal mask. In order to secure printability of a solder paste, it is necessary for the viscosity of the solder paste to be appropriate. Here, if the amount of activators is increased or a highly active one is used to improve the wettability of a solder paste, the viscosity of the solder paste will increase over time. For this reason, in the solder alloy in the related art, it is impossible to have a required thickening suppression effect when used in a solder paste, in addition to having the required heat cycle characteristics at the same time, and further research thereon is required.

A problem to be solved by the present invention is to provide a solder alloy which can withstand the severe characteristics of a temperature cycle between a low temperature of −40° C. and a high temperature of 125° C. for a long period of time, withstand an external force applied due to, for example, riding on a curb or collision with a vehicle ahead for a long period of time, and in which change in viscosity of a solder paste over time can be suppressed. In addition to this, another problem to be solved by the present invention is to provide: a solder paste, a solder ball, and a solder preform in which the above-described solder alloy is used; a solder joint formed through the use thereof; and an on-board electronic circuit, an ECU electronic circuit, an on-board electronic circuit device, and an ECU electronic circuit device which include this solder joint.

Solution to Problem

The present inventors have found that it is effective to add an element that dissolves in an Sn phase to produce a solid-solution strengthened alloy in order to withstand an external force after temperature cycles for a long period of time, Sb is an optimal element to produce a solid-solution precipitation strengthened alloy, and an effect of strengthening precipitation and dispersion is exhibited due to formation of a fine Sn—Sb intermetallic compound caused by addition of Sb to an Sn matrix.

Regarding the metallurgical, structural features of the solder alloy according to the present invention, the solder alloy has a structure in which Sb dissolves in an Sn matrix. The structure exhibits a state in which Sb stably dissolves at a high temperature of 125° C., for example. However, as the temperature decreases, Sb gradually dissolves in the Sn matrix in a supersaturated state. Then, Sb precipitates as Sn—Sb intermetallic compounds at a low temperature of −40° C., for example.

The solder alloy according to the present invention produces fine Sb precipitates even after these are exposed to temperature cycles, and the reason why structural deterioration such as coarsening of these compounds is not caused is thought to be as follows.

A solder alloy for joining through reflow soldering can be subjected to a temperature cycle test at −40° C. to +125° C. modelling a low temperature in cold regions and a high temperature in an engine compartment. Steps of redissolving Sb contained in the solder alloy according to the present invention in an Sn matrix at a high temperature of, for example, 125° C. and precipitating Sn—Sb intermetallic compounds at a low temperature of, for example, −40° C. are repeated. For this reason, coarsening of Sn—Sb intermetallic compounds is stopped, and temporarily coarsened Sn—Sb intermetallic compounds also redissolve in the Sn matrix at a high temperature while conducting the temperature cycle test. Therefore, fine Sn—Sb intermetallic compounds are formed and a precipitation- and dispersion-strengthened solder alloy is maintained.

However, in a case where the amount of Sb is greater than 5.3 mass %, for example, 8 mass %, particle diameters of Sn—Sb compounds at an initial stage of the temperature cycle test are not fine and the liquidus temperature increases. Therefore, the original Sn—Sb crystal grains are retained without redissolving of Sb even at a high temperature. Accordingly, even if the solder alloy is repeatedly used under the above-described temperature cycles, fine Sn—Sb intermetallic compounds are not formed.

Furthermore, if the amount of Sb is greater than 5.3 mass %, the liquidus temperature of the solder alloy increases. Therefore, soldering cannot be performed unless the temperature of reflow heating is raised. If there is such a rise therein with regard to the reflow conditions, Cu on the surface of a printed board melts in the solder, a thick Sn—Cu intermetallic compound layer of $Cu_6Sn_5$ or the like is likely to be formed in the portion soldered to the printed board, and the solder joint and the printed board are likely to break.

In the present invention, a predetermined amount of Sb becomes fine precipitates in the form of Sn—Sb compounds in the Sn matrix of the solder alloy. In the solder alloy according to the present invention, even if a temperature cycle between −40° C. and +125° C. is repeated over nearly 3,000 cycles, the state of fine precipitates of Sn—Sb intermetallic compounds can be maintained in the Sn matrix. As a result, cracks that are likely to occur at an interface between electronic components and solder joints are inhibited by the Sn—Sb precipitates.

In addition to this, in a case where the amount of Bi is 1.5 to 7 mass %, the above-described effects due to Sb can be synergistically exhibited since Bi replaces Sb. In view of the above-described alloy structure, it is thought that the two are closely related to each other. As a result of investigating the amount of both elements in detail, it has also been found that there is a suitable range of the amount of Bi depending on the amount of Sb.

In addition, out of various elements, the present inventors have attempted to intentionally add a trace amount of As to an Sn—Ag—Cu—Bi—Sb—Ni solder alloy having excellent temperature cycle characteristics as described above. A solder alloy having a high Sn content is known to form an $SnO_2$ film as described above, and a solder alloy containing As is usually considered to be inferior in wettability. Therefore, addition of As to a solder alloy has been avoided. However, unexpectedly, they have found that, in addition to the above-described findings, in an Sn—Ag—Cu—Bi—Sb—Ni—As solder alloy containing a predetermined amount of As, excellent wettability is maintained and an excellent thickening suppression effect is obtained due to formation of an As-concentrated layer on the surface of the solder alloy, and have completed the present invention.

As described above, excellent temperature cycle characteristics and a thickening suppression effect are not exhibited at the same time in a case of having no required contents for only one of each of these constituent elements. These effects are exhibited at the same time only in a case where each constituent element is within the required ranges of the present invention at the same time as in the present invention. These are the first findings obtained in the solder alloy according to the present invention.

The present invention obtained from these findings is as follows.

(1) A solder alloy containing, by mass %, 1% to 4% of Ag, 0.5% to 1.0% of Cu, 1.5% to 5.5% of Bi, 1.0% to 5.3% of Sb (or greater than 5.5% and less than or equal to 7.0% of Bi and 2.0% to 5.3% of Sb), 0.01% to 0.2% of Ni, 0.0040% to 0.0250% of As, and a balance of Sn, and including: an As-concentrated layer, in which the presence of the As-concentrated layer is confirmed by determination criteria below, the As-concentrated layer is a region from an outermost surface of the solder alloy to a depth of 2×D1 (nm) in terms of $SiO_2$, and a thickness of the As-concentrated layer in terms of $SiO_2$ is 0.5 to 8.0 nm.

(Determination Criteria)

In a sample having a size of 5.0 mm×5.0 mm, an arbitrary area of 700 μm×300 μm is selected, and XPS analysis is performed in combination with ion sputtering. One area is selected for each sample, and each of three samples is analyzed once, for a total of three analyses. In a case where S1>S2 in all of the three analyses, it is determined that an As-concentrated layer has been formed.

Here,

S1: Integrated value of a detection intensity of As in a region from a depth of 0 to 2×D1 (nm) in terms of $SiO_2$ in a chart of XPS analysis S2: Integrated value of a detection intensity of As in a region from a depth of 2×D1 to 4×D1 (nm) in terms of $SiO_2$ in a chart of XPS analysis D1: Initial depth (nm) in terms of $SiO_2$ at which the detection intensity of O atoms is ½ the maximum detection intensity (intensity at Do·max) in a portion deeper than the depth (Do·max (nm)) in terms of $SiO_2$ at which the detection intensity of O atoms is a maximum (2) The solder alloy according to the above-described (1) further containing less than or equal to 0.2% of In by mass %.

(3) The solder alloy according to the above-described (1) or (2) further containing less than or equal to 0.1% of Co by mass %.

(4) A solder paste including: a solder powder formed of the solder alloy according to any one of the above-described (1) to (3); and a flux.

(5) A solder ball formed of the solder alloy according to any one of the above-described (1) to (3).

(6) A solder preform formed of the solder alloy according to any one of the above-described (1) to (3).

(7) A solder joint made of the solder alloy according to any one of the above-described (1) to (3).

(8) An on-board electronic circuit including: the solder alloy according to any one of the above-described (1) to (3).

(9) An ECU electronic circuit including: the solder alloy according to any one of the above-described (1) to (3).

(10) An on-board electronic circuit device including: the on-board electronic circuit according to the above-described (8).

(11) An ECU electronic circuit device including: the ECU electronic circuit according to the above-described (9).

In the present invention, "on-board" means that a circuit is mounted on a vehicle and specifically means that predetermined characteristics can be secured even if a circuit is repeatedly exposed to and used in a severe usage environment, that is, a temperature environment of −40° C. to 125° C., and that a circuit is mountable on a vehicle. More specifically, "on-board" means that a circuit can withstand a heat cycle test of 3,000 cycles even in such a temperature environment and is resistant in a shear test for evaluating an external force even under such conditions.

DESCRIPTION OF EMBODIMENTS

Figure 1:
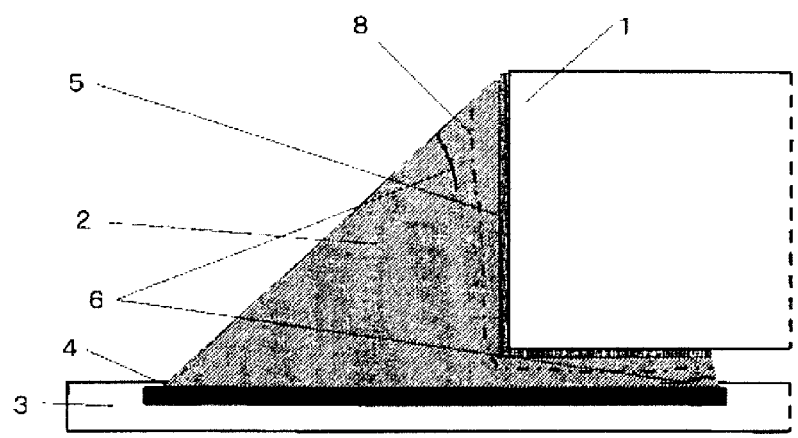
FIG. 1 is a schematic diagram illustrating a method for calculating a crack rate.

The present invention will be described in more detail below. In the following description, "%" relating to a solder alloy composition is "mass %" unless otherwise specified.

1. Solder Alloy (1) Ag: 1% to 4%

Ag has an effect of improving wettability of a solder alloy and can improve the temperature cycle characteristics by precipitating network-like compounds such as an intermetallic compound $Ag_3Sn$ in a solder matrix and forming a precipitation- and dispersion-strengthened alloy.

In the solder alloy according to the present invention, if the amount of Ag is less than 1%, the wettability of a solder alloy is not improved, and the intermetallic compound network is not strengthened due to a small precipitation amount of $Ag_3Sn$. The lower limit of the amount of Ag is greater than or equal to 1%, preferably greater than or equal to 2%, and more preferably greater than or equal to 3.3%. In addition, if the amount of Ag is greater than 4%, the liquidus temperature of a solder alloy increases and Sb added to the present invention does not melt again, whereby the effect of refining of Sn—Sb is inhibited. The upper limit of the amount of Ag is less than or equal to 4% and preferably less than or equal to 3.5%.

(2) Cu: 0.5% to 1.0%

Cu can prevent Cu corrosion in response to Cu lands, and can improve the temperature cycle characteristics by precipitating a fine compound $Cu_6Sn_5$ in a matrix of a solder alloy.

If the amount of Cu is less than 0.5%, Cu corrosion in response to a Cu land is not prevented. The lower limit of the amount of Cu is greater than or equal to 0.5% and preferably greater than or equal to 0.65%. On the other hand, if the amount of Cu is greater than 1.0%, a large amount of intermetallic compounds $Cu_6Sn_5$ precipitates also at a joining interface. Therefore, cracks grow faster due to vibration or the like. The upper limit of the amount of Cu is less than or equal to 1% and preferably less than or equal to 0.75%.

(3) Bi: 1.5% to 5.5% and Sb: 1.0% to 5.3%, or Bi: Greater Than 5.5% and Less Than or Equal to 7.0% and Sb: 2% to 5.3%

Sb forms a structure which exhibits a state in which Sb dissolves in Sn at 125° C. in a temperature cycle test, and as the temperature decreases, Sb gradually dissolves in an Sn matrix in a supersaturated state and Sb precipitates as Sn—Sb intermetallic compounds at −40° C. Accordingly, the solder alloy according to the present invention can exhibit excellent temperature cycle characteristics.

If the amount of Sb is less than 1.0%, the amount of Sb is too small to exhibit a solid-solution strengthening effect. In addition, if the amount of Sb is greater than 5.3%, the liquidus temperature increases. Therefore, since Sb does not melt again at a high temperature higher than 125° C. during engine operation in hot weather, coarsening of Sn—Sb compounds progresses, whereby propagation of cracks in Sn phase grains cannot be inhibited. Accordingly, it is necessary for the solder alloy according to the present invention to at least have an Sb content within a range of 1.0% to 5.3%.

Bi can further improve the temperature cycle characteristics. Sb not only precipitates Sn—Sb intermetallic compounds to produce precipitation- and dispersion-strengthened alloys but also has an effect of improving the temperature cycle characteristics by entering an Sn crystal lattice to replace Sn and distort the Sn crystal lattice. At this time, if the solder alloy contains Bi, Bi having a large effect of distorting a crystal lattice due to a larger atomic weight than that of Sb replaces Sb. Therefore, the temperature cycle characteristics can be further improved. In addition, since Bi does not interfere in the formation of fine Sn—Sb compounds, a precipitation- and dispersion-strengthened solder alloy is maintained.

If the amount of Bi is less than 1.5%, replacement with Sb is unlikely to occur and the effect of improving the temperature cycle is not exhibited. In addition, if the amount of Bi is greater than 7.0%, the ductility of a solder alloy itself becomes low and the solder alloy becomes hard and brittle. Therefore, cracks grow faster due to vibration or the like.

Since Sb and Bi can synergistically improve the temperature cycle characteristics or the like as described above, the range of the amount of Sb is determined according to the range of the amount of Bi. The amount of both elements in the solder alloy according to the present invention has a predetermined relation with each other. In a case where the amount of Bi is 1.5% to 5.5%, the amount of Sb is 1.0% to 5.3%. In a case where the amount of Bi is greater than 5.5% and less than or equal to 7.0%, the amount of Sb is 2.0% to 5.3%.

The lower limit of the amount of Bi in the case where the amount of Bi is 1.5% to 5.5% is preferably greater than or equal to 2.0% and more preferably greater than or equal to 3.0%. The upper limit of the amount of Bi in the case where the amount of Bi is 1.5% to 5.5% is preferably less than or equal to 5.2%. In addition, the lower limit of the amount of Sb in the case where the amount of Sb is 1.0% to 5.3% is preferably greater than or equal to 2.0% and more preferably greater than or equal to 2.8%. The upper limit of the amount of Sb in the case where the amount of Sb is 1.0% to 5.3% is preferably less than or equal to 5.2%.

The lower limit of the amount of Bi in the case where the amount of Bi is greater than 5.5% and less than or equal to 7.0% is preferably greater than or equal to 5.6% and more preferably greater than or equal to 6.0%. In addition, the lower limit of the amount of Sb in the case where the amount of Sb is 2.0% to 5.3% is preferably greater than or equal to 3.0%. The upper limit of the amount of Sb in the case where the amount of Sb is 2.0% to 5.3% is preferably less than or equal to 5.0% and more preferably less than or equal to 4.0%.

(4) Ni: 0.01% to 0.2%

In the solder alloy of the present invention, the occurrence and propagation of cracks in a solder are inhibited and the occurrence of cracks at a solder joint interface is also inhibited. For example, if Cu land soldering is performed, intermetallic compounds $Cu_6Sn_5$ are generated at a joining interface with a Cu land. The solder alloy according to the present invention contains 0.01% to 0.2% of Ni. Ni moves to a soldering interface portion during soldering to form $(CuNi)_6Sn_5$ instead of $Cu_6Sn_5$. Then, the concentration of Ni of an intermetallic compound layer increases. Accordingly, an intermetallic compound layer of $(CuNi)_6Sn_5$ which is finer than $Cu_6Sn_5$ and has a uniform particle diameter is formed at the soldering interface.

The fine intermetallic compound layer of $(CuNi)_6Sn_5$ has an effect of inhibiting cracks propagating from an interface. In the intermetallic compound layer of $Cu_6Sn_5$ with a large particle diameter, cracks which have occurred propagate along with the large particle diameter. Therefore, the cracks progress quickly. However, when the particle diameter is fine, the stress of cracks which have occurred is dispersed in many particle diameter directions. Therefore, the progress of cracks can be slowed down.

Since the solder alloy according to the present invention contains Ni in this manner, an intermetallic compound layer formed in the vicinity of a soldering interface is made fine to inhibit the propagation of cracks. For this reason, the solder alloy according to the present invention can also inhibit the occurrence of cracks from the interface.

If the amount of Ni is less than 0.01%, the amount of Ni at a soldering interface is small. Therefore, there is no effect of inhibiting cracks. The lower limit of the amount of Ni is greater than or equal to 0.01% and preferably greater than or equal to 0.03%. On the other hand, if the amount of Ni is greater than 0.2%, the liquidus temperature increases. Therefore, Sb added to the present invention does not melt again and the effect of refining of Sn—Sb is inhibited. The upper limit of the amount of Ni is less than or equal to 0.2%, preferably less than or equal to 0.1%, and more preferably less than or equal to 0.05%.

(5) As: 0.0040% to 0.025%

If the solder alloy according to the present invention is added to a solder paste as a solder powder, As can exhibit the thickening suppression effect of a solder paste therewith. The amount of As needs to be greater than or equal to 0.0040% with regard to a lower limit thereof in order for the effects due to inclusion of As to be exhibited sufficiently. On the other hand, if the amount of As is greater than 0.025%, the wettability deteriorates. The upper limit of the amount of As is less than or equal to 0.025%, preferably less than or equal to 0.020%, and more preferably less than or equal to 0.010%.

The As-concentrated layer formed due to incorporation of As in the present invention is a region in which the concentration of As is higher than the average concentration (ratio of the mass of As to the mass of a solder alloy) of As in a solder material, and is specifically a region from the outermost surface of a solder alloy to a depth of 2×D1 (nm) in terms of $SiO_2$. The presence of the As-concentrated layer can be confirmed by determination criteria described below. The As-concentrated layer is preferably present on at least a part of the surface side of a solder alloy and preferably covers the entire surface.

If an As-concentrated layer is formed due to incorporation of As as in the present invention, the change in the viscosity of a solder paste over time can be suppressed. Although the reason for this is unclear, it is inferred to be as follows. It is thought that the increase in the viscosity is caused by formation of salts due to a reaction caused between Sn or an Sn oxide and various additives such as an activator contained in a solder paste (flux) or coagulation of a solder powder. It is inferred that, if an As-concentrated layer is present on the surface of the solder alloy according to the present invention, the As-concentrated layer is interposed between a solder powder and a flux, and the above-described reaction is unlikely to occur, and therefore, the above-described effects are exhibited.

(5-1) Determination Criteria of As-Concentrated Layer In a sample having a size of 5.0 mm×5.0 mm (in a case where a solder material is not plate-shaped, one obtained by spreading a solder material (such as a solder powder or a solder ball) without any gaps over a range of 5.0 mm×5.0 mm), an arbitrary area of 700 μm×300 μm is selected, and XPS analysis is performed in combination with ion sputtering. One area is selected for each sample, and each of three samples is analyzed once, for a total of three analyses. In a case where S1≥S2 in all of the three analyses, it is determined that an As-concentrated layer has been formed.

Here, the definition of S1, S2, and D1 is as follows.

S1: Integrated value of a detection intensity of As in a region from a depth of 0 to 2×D1 (nm) in terms of $SiO_2$ in a chart of XPS analysis performed on the above-described sample S2: Integrated value of a detection intensity of As in a region from a depth of 2×D1 to 4×D1 (nm) in terms of $SiO_2$ in a chart of XPS analysis D1: Initial depth (nm) in terms of $SiO_2$ at which a detection intensity of O atoms is ½ a maximum detection intensity (intensity at Do·max) in a portion deeper than the depth (Do·max (nm)) in terms of $SiO_2$ at which a detection intensity of O atoms is a maximum The detailed conditions of the above-described determination criteria of the As-concentrated layer follow the description of examples. By having an As-concentrated layer on the surface of the solder alloy according to the present invention, the increase in the viscosity of a solder paste can be suppressed.

(5-2) Thickness of As-Concentrated Layer

The thickness (in terms of $SiO_2$) of an As-concentrated layer is 0.5 to 8.0 nm, more preferably 0.5 to 4.0 nm, and most preferably 0.5 to 2.0 nm If the thickness of an As-concentrated layer is within the above-described ranges, a solder material having excellent wettability is obtained.

(6) In: Less Than or Equal to 0.2%

In addition, since the solder alloy according to the present invention contains In as an arbitrary element, it becomes a solid-solution strengthened Sn—In alloy. Therefore, the temperature cycle characteristics can be improved.

The lower limit of the amount of In is not particularly limited, but is preferably greater than or equal to 0.01%. A solid-solution strengthened Sn—In alloy is formed within this range. The lower limit of the amount of In is more preferably greater than or equal to 0.05%. In addition, if the amount of In is less than or equal to 0.2%, coarse Sb—In compounds are not formed. Therefore, the occurrence of cracks inside a solder alloy can be inhibited. The upper limit of the amount of In is preferably less than or equal to 0.1%.

(7) Co: Less Than or Equal to 0.1%

Furthermore, since the solder alloy according to the present invention contains Co as an arbitrary element, the effect of Ni of the present invention can be enhanced.

The lower limit of the amount of Co is not particularly limited, but is preferably greater than or equal to 0.001%. Within the range, the effect of preventing the growth of interfacial cracks due to Co precipitating at a joining interface is exhibited. On the other hand, if the content thereof is preferably less than or equal to 0.1%, an intermetallic compound layer precipitate at an interface does not become thick, and the growth of cracks due to vibration or the like can be inhibited.

The lower limit of the amount of Co in the case where the solder alloy according to the present invention contains Co is more preferably greater than or equal to 0.002%, still more preferably greater than or equal to 0.004%, particularly preferably greater than or equal to 0.005%, and most preferably greater than or equal to 0.008%. The upper limit of the amount of Co is preferably less than or equal to 0.05%, more preferably less than or equal to 0.012%, and particularly preferably less than or equal to 0.010%.

(8) Balance: Sn

The balance of the solder alloy according to the present invention is Sn. The solder alloy may contain unavoidable impurities in addition to the above-described elements. The inclusion of unavoidable impurities does not affect the above-described effects.

2. Solder Paste

The solder paste according to the present invention contains a flux and a solder powder.

(1) Component of Flux

A flux used in the solder paste is composed of any one or a combination of two or more of an organic acid, an amine, an amine hydrohalide, an organic halogen compound, a thixotropic agent, rosin, a solvent, a surfactant, a base agent, a polymer compound, a silane coupling agent, and a colorant.

Examples of organic acids include succinic acid, glutaric acid, adipic acid, pimelic acid, suberic acid, azelaic acid, sebacic acid, dimer acids, propionic acid, 2,2-bishydroxymethylpropionic acid, tartaric acid, malic acid, glycolic acid, diglycolic acid, thioglycolic acid, dithioglycolic acid, stearic acid, 12-hydroxystearic acid, palmitic acid, and oleic acid.

Examples of amines include ethylamine, triethylamine, ethylenediamine, triethylenetetramine, 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, a 2,4-diamino-6-[2'-methylimidazolyl-(1')]-ethyl-s-triazine-isocyanuric acid adduct, a 2-phenylimidazole-isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, 2-phenylimidazoline, 2,4-diamino-6-vinyl-s-triazine, a 2,4-diamino-6-vinyl-s-triazine-isocyanuric acid adduct, 2,4-diamino-6-methacryloyloxyethyl-s-triazine, an epoxy-imidazole adduct, 2-methylbenzimidazole, 2-octylbenzimidazole, 2-pentylbenzimidazole, 2-(1-ethylpentyl) benzimidazole, 2-nonylbenzimidazole, 2-(4-thiazolyl) benzimidazole, benzimidazole, 2-(2'-hydroxy-5'-methyl phenyl) benzotriazole, 2-(2'-hydroxy-3'-tert-butyl-5'-methylphenyl)-5-chlorobenzotriazole, 2-(2'-hydroxy-3',5'-di-tert-amylphenyl) benzotriazole, 2-(2'-hydroxy-5'-tert-octylphenyl) benzotriazole, 2,2'-methylenebis[6-(2H-benzotriazole-2-yl)-4-tert-octylphenol], 6-(2-benzotriazolyl)-4-tert-octyl-6'-tert-butyl-4'-methyl-2,2'-methylenebisphenol, 1,2,3-benzotriazole, 1-[N,N-bis(2-ethylhexyl) aminomethyl] benzotriazole, carboxybenzotriazole, 1-[N,N-bis(2-ethylhexyl) aminomethyl] methylbenzotriazole, 2,2'-[[(methyl-1H-benzotriazole-1-yl) methyl] imino]bisethanol, 1-(1',2'-dicarboxyethyl) benzotriazole, 1-(2,3-dicarboxypropyl) benzotriazole, 1-[(2- ethylhexyl amino)methyl] benzotriazole, 2,6-bis[(1H-benzotriazole-1-ye methyl]-4-methylphenol, 5-methylbenzotriazole, and 5-phenyltetrazole.

An amine hydrohalide is a compound obtained by reacting an amine and a hydrogen halide, and examples of amines include ethylamine, ethylenediamine, triethylamine, di phenyl guanidine, ditolylguanidine, methylimidazole, and 2-ethyl-4-methylimidazole, and examples of hydrogen halides include hydrides of chlorine, bromine, and iodine.

Examples of organic halogen compounds include trans-2,3-dibromo-2-butene-1,4-diol, triallyl isocyanurate hexabromide, 1-bromo-2-butanol, 1-bromo-2-propanol, 3-bromo-1-propanol, 3-bromo-1,2-propanediol, 1,4-dibromo-2-butanol, 1,3-dibromo-2-propanol, 2,3-dibromo-1-propanol, 2,3-dibromo-1,4-butanediol, and 2,3-dibromo-2-butene-1,4-diol.

Examples of thixotropic agents include a wax-based thixotropic agent, an amide-based thixotropic agent, and a sorbitol-based thixotropic agent. Examples of wax-based thixotropic agents include hydrogenated castor oil. Examples of amide-based thixotropic agents include a monoamide-based thixotropic agent, a bisamide-based thixotropic agent, and a polyamide-based thixotropic agent, and specific examples thereof include lauric acid amide, palmitic acid amide, stearic acid amide, behenic acid amide, hydroxystearic acid amide, saturated fatty acid amides, oleic acid amide, erucic acid amide, unsaturated fatty acid amides, p-toluene methane amide, aromatic amide, methylenebisstearic acid amide, ethylenebislauric acid amide, ethylenebishydroxystearic acid amide, saturated fatty acid bisamide, methylenebisoleic acid amide, unsaturated fatty acid bisamide, m-xylylenebisstearic acid amide, aromatic bisamide, saturated fatty acid polyamide, unsaturated fatty acid polyamide, aromatic polyamide, substituted amides, methylol stearic acid amide, methylol amide, and fatty acid ester amides. Examples of sorbitol-based thixotropic agents include dibenzylidene-D-sorbitol and bis(4-methylbenzylidene)-D-sorbitol.

Examples of base agents include nonionic surfactants, weak cationic surfactants, and rosin.

Examples of nonionic surfactants include polyethylene glycol, a polyethylene glycol-polypropylene glycol copolymer, an aliphatic alcohol-polyoxyethylene adduct, an aromatic alcohol-polyoxyethylene adduct, and a polyhydric alcohol-polyoxyethylene adduct.

Examples of weak cationic surfactants include terminal diamine polyethylene glycol, a terminal diamine polyethylene glycol-polypropylene glycol copolymer, an aliphatic amine-polyoxyethylene adduct, an aromatic amine-polyoxyethylene adduct, and a polyvalent amine-polyoxyethylene adduct.

Examples of rosin include raw rosin such as gum rosin, wood rosin, and tall oil rosin, and derivatives obtained from the raw rosin. Examples of the derivatives include purified rosin, hydrogenated rosin, disproportionated rosin, polymerized rosin, an α,β-unsaturated carboxylic acid-modified product (such as acrylated rosin, maleated rosin, or fumarated rosin), a purified product, a hydride, and a disproportionated product of the polymerized rosin, and a purified product, a hydride, and a disproportionated product of α,β-unsaturated carboxylic acid-modified products, and two or more kinds thereof can be used. In addition to a rosin resin, the flux can further contain at least one resin selected from a terpene resin, a modified terpene resin, a terpene phenol resin, a modified terpene phenol resin, a styrene resin, a modified styrene resin, a xylene resin, and a modified xylene resin. An aromatic modified terpene resin, a hydrogenated terpene resin, a hydrogenated aromatic modified terpene resin, or the like can be used as a modified terpene resin. A hydrogenated terpene phenol resin or the like can be used as a modified terpene phenol resin. A styrene-acrylic resin, a styrene-maleic acid resin, or the like can be used as a modified styrene resin. Examples of modified xylene resins include a phenol-modified xylene resin, an alkylphenol-modified xylene resin, a phenol-modified resol-type xylene resin, a polyol-modified xylene resin, and a polyoxyethylene-added xylene resin.

Examples of solvents include water, an alcoholic solvent, a glycol ether-based solvent, and terpineols. Examples of alcoholic solvents include isopropyl alcohol, 1,2-butanediol, isobornyl cyclohexanol, 2,4-diethyl-1,5-pentanediol, 2,2-dimethyl-1,3-propanediol, 2,5-dimethyl-2,5-hexanediol, 2,5-dimethyl-3-hexyne-2,5-diol, 2,3-dimethyl-2,3-butanediol, 1,1,1-tris(hydroxymethypethane, 2-ethyl-2-hydroxymethyl-1,3-propanediol, 2,2'-oxybis(methylene)bis(2-ethyl-1,3-propanediol), 2,2-bis(hydroxymethyl)-1,3-propanediol, 1,2,6-trihydroxyhexane, bis[2,2,2-tris(hydroxymethypethyl]ether, 1-ethynyl-1-cyclohexanol, 1,4-cyclohexanediol, 1,4-cyclohexane dimethanol, erythritol, threitol, guaiacol glycerol ether, 3,6-dimethyl-4-octyne-3,6-diol, and 2,4,7,9-tetramethyl-5-decyne-4,7-diol. Examples of glycol ether-based solvents include diethylene glycol mono-2-ethylhexyl ether, ethylene glycol monophenyl ether, 2-methylpentane-2,4-diol, diethylene glycol monohexyl ether, diethylene glycol dibutyl ether, and triethylene glycol monobutyl ether.

Examples of surfactants include polyoxyalkylene acetylene glycols, polyoxyalkylene glyceryl ether, polyoxyalkylene alkyl ether, polyoxyalkylene ester, polyoxyalkylene alkylamine, and polyoxyalkylene alkylamide.

(2) Amount of Flux

The amount of a flux based on the total mass of a solder paste is preferably 5% to 95% and more preferably 5% to 15%. Within these ranges, the thickening suppression effect due to a solder powder is sufficiently exhibited.

(3) Solder Powder

A solder powder used in the solder paste according to the present invention is preferably a spherical powder. The spherical powder improves the fluidity of solder alloys.

In addition, in the case where the solder alloy is spherical powders which have sizes (grain size distribution) corresponding to Symbols 1 to 8 in the classification (Table 2) of the powder size in JIS Z 3284-1:2014, soldering on fine components can be performed. Particulate solder materials more preferably have sizes corresponding to Symbols 4 to 8 and still more preferably have sizes corresponding to Symbols 5 to 8. The sphericity thereof is preferably greater than or equal to 0.90, more preferably greater than or equal to 0.95, and most preferably greater than or equal to 0.99.

In the present invention, the spherical diameter and the sphericity of a solder alloy which is a spherical powder is measured with a CNC image measurement system (Ultra Quick Vision ULTRA QV350-PRO Measurement Device manufactured by Mitutoyo Corporation) in which minimum zone center method (MZC method) is used. In the embodiment, the sphericity represents deviation from a true sphere and is an arithmetic average value calculated when, for example, diameters of 500 balls are divided by major axes. As the value is closer to 1.00 which is the upper limit, the balls are closer to true spheres.

(4) Method for Producing Solder Paste

The solder paste according to the present invention is produced through a method common in the art. First, well-known methods such as a dropping method in which a molten solder material is added dropwise to obtain particles, a spraying method in which the molten solder material is centrifugally sprayed, and a method in which a bulk solder material is pulverized can be employed for the production of a solder powder. In the dropping method or the spraying method, dropping or spraying is preferably performed in an inert atmosphere or a solvent in order to form particles. The above-described components can be heated and mixed with each other to prepare a flux, the above-described solder powder can be introduced into the flux, and the mixture can be stirred and mixed to produce a solder paste.

3. Solder Ball

The solder alloy according to the present invention can be used as a solder ball.

In the case where the solder alloy according to the present invention is used as a solder ball, a solder ball can be produced through a dropping method which is a method common in the art. In addition, a solder joint can be produced by processing a solder ball through a method common in the art, for example, through joining of the solder ball by mounting the solder ball on one electrode coated with a flux. The particle diameter of a solder ball is preferably greater than or equal to 1 µm, more preferably greater than or equal to 10 µm, still more preferably greater than or equal to 20 µm, and particularly preferably greater than or equal to 30 The upper limit of the particle diameter of a solder ball is preferably less than or equal to 3,000 µm, more preferably less than or equal to 1,000 µm, still more preferably less than or equal to 600 µm, and particularly preferably less than or equal to 600 µm.

4. Solder Preform

The solder alloy according to the present invention can be used as a preform.

Examples of the shape of a preform include washers, rings, pellets, discs, ribbons, and wires.

5. Solder Joint

The solder alloy according to the present invention can form a solder joint by joining an electrode of a package (PKG) of an IC chip or the like to an electrode of a board such as a printed circuit board (PCB). The solder joint according to the present invention includes an electrode and a solder joint portion. The solder joint portion refers to a portion mainly formed of a solder alloy.

6. On-Board Electronic Circuit, ECU Electronic Circuit, On-Board Electronic Circuit, and ECU Electronic Circuit Device As is apparent from the above description, the solder alloy according to the present invention has excellent heat cycle characteristics and the occurrence and propagation of cracks in a solder alloy is inhibited. For this reason, even if the solder alloy according to the present invention is used for vehicles, that is, on-board purposes, which are used in a state where vibration is constantly received, the growth or development of cracks is not promoted. Accordingly, it can be seen that the solder alloy according to the present invention is particularly suitable for soldering electronic circuits to be mounted on vehicles since it has such particularly significant characteristics.

Here, the "excellent heat cycle characteristics" referred to in the present specification means that the crack occurrence rate after 3,000 cycles is less than or equal to 90% and, similarly, the shear strength residual rate after 3,000 cycles is greater than or equal to 30% even if a heat cycle test is performed at −40° C. to +125° C. as will also be shown in the examples to be described below.

Such characteristics mean that an on-board electronic circuit does not break even if it is used under extremely severe conditions such as the above-described heat cycle test, that is, it does not become unusable or does not cause malfunction. The solder alloy according to the present invention is particularly highly reliable as a solder alloy used for soldering for an ECU. Furthermore, the solder alloy according to the present invention has an excellent shear strength residual rate after the temperature cycles. That is, even after it is used for a long period of time, the resistance to external force, such as shear strength, against external force such as collision, vibration, or the like applied from the outside does not decrease.

In this manner, the solder alloy according to the present invention is more specifically used for soldering an on-board electronic circuit or an ECU electronic circuit and exhibits excellent heat cycle characteristics.

The "electronic circuit" is a system that exerts a desired function as a whole through an electronically engineered combination of a plurality of electronic components respectively having functions.

Examples of such electronic components constituting electronic circuits include chip resistor components, multiple resistor components, QFP, QFN, power transistors, diodes, and capacitors. Electronic circuits in which these electronic components are incorporated are provided on a board and constitute an electronic circuit device.

In the present invention, such a board, for example, a printed wiring board, constituting an electronic circuit device is not particularly limited. In addition, the material thereof is not particularly limited, but a heat-resistant plastic board (for example, FR-4 with high Tg and low CTE) is exemplified. A printed circuit board obtained by treating the surface of a Cu land with an organic substance (organic surface protection: OSP) such as amines or imidazole is preferable as a printed wiring board.

7. Method for Forming Solder Alloy

A method for producing the solder alloy according to the present invention is not limited and can be produced by melting and mixing raw materials.

A method for forming an As-concentrated layer in a solder alloy is also not limited. Examples of the method for forming an As-concentrated layer include heating of a solder material in an oxidation atmosphere (air or oxygen atmosphere). The heating temperature is not limited, but can be set to 40° C. to 200° C., and may be 50° C. to 80° C. The heating time is also not limited, and can be set to several minutes to several days and preferably several minutes to several hours. In order to form a sufficient amount of an As-concentrated layer, the heating time is preferably longer than or equal to 10 minutes and more preferably longer than or equal to 20 minutes. By subjecting the above-described solder powder, solder ball, and solder preform to, for example, this heat treatment, an As-concentrated layer is formed.

A low α-ray material can be used as a raw material of the solder alloy according to the present invention to produce a low α-ray alloy. If such a low α-ray alloy is used to form solder bumps around a memory, soft errors can be suppressed.

Examples

1. Temperature Cycle Test (Crack Reliability and Shear Strength Reliability), 2. As Surface Concentration, and 3. Thickening Suppression were evaluated using solder alloys (mass %) described in examples and comparative examples in Tables 1 to 4.

1. Temperature Cycle Test (1-1) Crack Reliability (Crack Rate)

The solder alloys of Tables 1 to 4 were atomized to obtain solder powders. Each of the solder powders was mixed with a soldering flux containing pine resin, a solvent, an activator, a thixotropic agent, an organic acid, and the like to prepare a solder paste of each solder alloy. After the solder paste was printed on a 6-layer printed board with a 150 μm metal mask, a 3216 chip resistor was mounted with a mounter, and reflow soldering was performed under the conditions of the maximum temperature of 235° C. in the examples, the maximum temperature of 280° C. in the comparative examples, and a holding time of 40 seconds to produce a test board. The solder powders were obtained by heating solder powders which have an average particle diameter of 21 μm and correspond to numerical sign 5 in the classification (Table 2) of the powder size in JIS Z3284-1:2014 for 30 minutes at 60° C. with a dryer in atmospheric air. A solder powder which has not been subjected to heat treatment was used only in Comparative Example 25.

The test board soldered with each solder alloy was placed in a temperature cycle tester set at the conditions of a low temperature of −40° C., a high temperature of +125° C., and a holding time of 30 minutes, and was taken out of the temperature cycle tester after 3,000 cycles at each condition, the condition of cracks was observed with a 150×metallurgical microscope, the total length of cracks was assumed, and the crack rate was measured.

Crack rate (%)=(sum of crack lengths)×100/(total length of assumption line cracks)

Here, the "total length of assumption line cracks" refers to lengths of completely broken cracks. The crack rate is a rate obtained by dividing the total length of a plurality of cracks 6 shown in FIG. 1 by the length of an expected crack development path 8. In these examples, in a case where the crack rate was less than or equal to 90%, the crack reliability scored "○" since there is no problem in practical use, and in a case where the crack rate was greater than 90%, the crack reliability scored "x".

(1-2) Shear Strength Reliability (Shear Strength Residual Rate)

The shear strength reliability is an index of how much strength is maintained in a temperature cycle test with respect to the shear strength of a solder joint in an initial state before the temperature cycle test.

A shear strength test was performed with a joint strength tester STR-1000 at room temperature under the conditions of a test speed of 6 mm/min and a test height of 50 μm. The shear strength residual rate (%) was obtained by (initial shear strength)×100/(shear strength after temperature cycle test). In these examples, in a case where the shear strength residual rate was greater than or equal to 30%, the shear strength reliability scored "○" since there is no problem in practical use, and in a case where the shear strength reliability was less than 30%, the shear strength reliability scored "x".

2. As Surface Concentration

The As surface concentration was evaluated as follows using depth direction analysis through X-ray photoelectron spectroscopy (XPS).

(Analysis Conditions)

Analyzer: Micro-region X-ray photoelectron spectroscopic analyzer (AXIS Nova manufactured by Kratos Analytical Limited)

Analysis condition: X-Ray source being AlKα line, X-ray gun voltage being 15 kV, X-ray gun current value being 10 mA, and analysis area being 700 μm×300 μm Sputtering conditions: Ion type being Ar+, accelerating voltage being 2 kV, sputtering rate being 0.5 nm/min (in terms of $SiO_2$)

Samples: Three samples obtained by flatly spreading each solder powder obtained in "1. Temperature Cycle Test" without any gap on a stage to which carbon tape was stuck were prepared as samples. However, the sizes of the samples were set to 5.0 mm×5.0 mm. Solder powders which have an average particle diameter of 21 μm and correspond to numerical sign 5 in the classification (Table 2) of the powder size in JIS Z3284-1:2014 were used.

(Evaluation Procedure)

An arbitrary area of 700 μm×300 μm was selected from each sample having a size of 5.0 mm×5.0 mm, and XPS analysis was performed on each of Sn, O, and As atoms while performing ion sputtering to obtain an XPS analysis chart. One area was selected for each sample, and each of three samples was analyzed once, for a total of three analyses.

Figure 2:
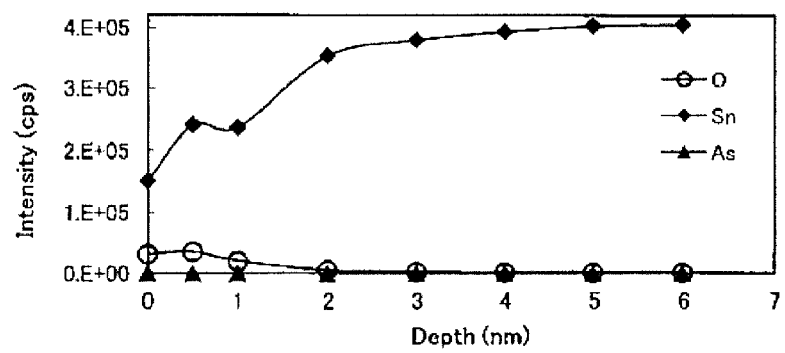
FIG. 2 is a chart of XPS analysis of a surface of a solder ball.
Figure 3:
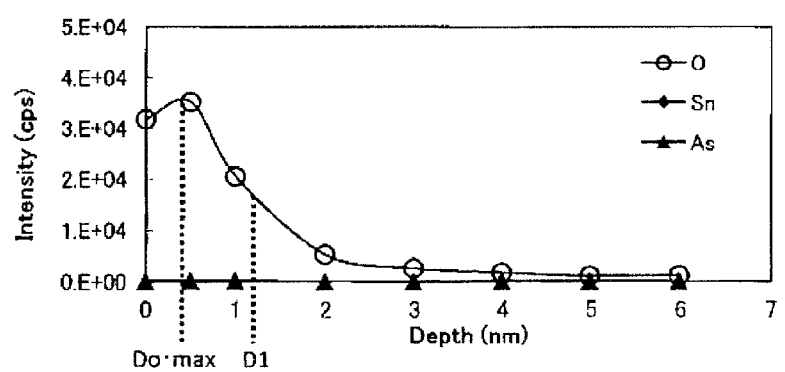
FIG. 3 is a chart of XPS analysis of a surface of a solder ball.
Figure 4:
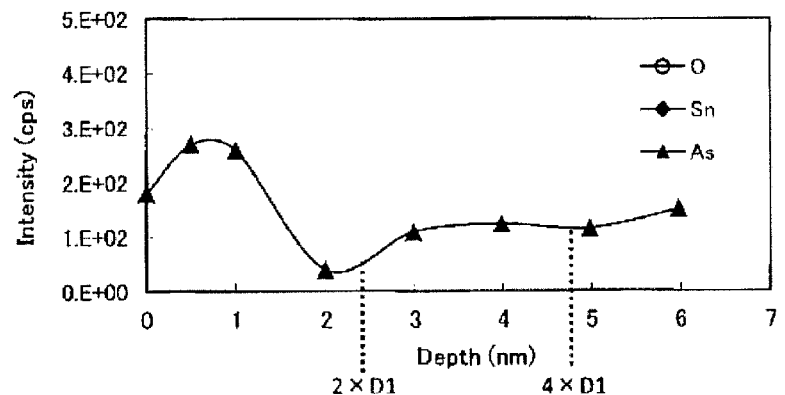
FIG. 4 is a chart of XPS analysis of a surface of a solder ball.

Examples of charts obtained from the XPS analysis are shown in FIGS. 2 to 4. FIGS. 2 to 4 are charts in which the scale of the detection intensity (cps) on the vertical axis is changed for an identical sample, and the horizontal axis is the depth (nm) in terms of $SiO_2$ calculated from the sputtering time. In the XPS analysis charts, the vertical axis is the detection intensity (cps). Although the horizontal axis can be selected from either the sputtering time (min) or the depth (nm) in terms of $SiO_2$ calculated from the sputtering time using a sputter-etching rate of an $SiO_2$ standard sample, the horizontal axis in the XPS analysis charts in FIGS. 2 to 4 is the depth (nm) in terms of $SiO_2$ calculated from the sputtering time using a sputter-etching rate of an $SiO_2$ standard sample.

Moreover, in the XPS analysis chart of each sample, the depth in terms of $SiO_2$ at which the detection intensity of an O atom was maximum was set to Do·max (nm) (refer to FIG. 3). Moreover, the initial depth in terms of $SiO_2$ at which the detection intensity of an O atom was ½ maximum detection intensity (intensity at Do·max) in a portion deeper than Do·max was set to D1 (nm).

Subsequently, in the XPS analysis chart of each sample, an integral value (S1) of the detection intensity of As in a region (region where the depth in terms of $SiO_2$ was 0 to 2×D1 (nm)) from the outermost surface to the depth 2×D1 and an integral value (S2) of the detection intensity of As in a region (region where the depth in terms of $SiO_2$ was 2×D1 to 4×D1 (nm)) from the depth 2×D1 to a portion deeper by 2×D1 were obtained (refer to FIG. 4) and were compared to each other.

Then, an evaluation was performed based on the following criteria.

S1>S2 at all three times of measurement: As-Concentrated layer is formed: (O)

S1>S2 at two or less times out of all three times of measurement: No As-concentrated layer is formed: (x)

3. Suppression of Thickening

A solder powder obtained in "1. Temperature Cycle Test" and a flux shown in Table 5 were heated and stirred so that the mass ratio (flux:solder powder) of the flux to the solder powder becomes 11:89, and were then cooled to produce a solder paste. The viscosity of these solder pastes was measured for 12 hours at a rotation frequency of 10 rpm and a measurement temperature of 25° C. using a rotational viscometer (PCU-205 manufactured by Malcolm Co., Ltd.)

according to the method described in "4.2 Test for Viscosity Characteristics" of JIS Z 3284-3:2014. An initial viscosity (viscosity after 30 minutes of stirring) was compared with a viscosity after 12 hours to evaluate the thickening suppression effect based on the following criteria.

Viscosity after 12 hours initial viscosity×1.2: Favorable due to small increase in viscosity over time: (○)

Viscosity after 12 hours>initial viscosity×1.2: Failure due to large increase in viscosity over time: (x)

TABLE 1

| | Alloy composition (mass %) | | | | | | | | Crack reliability | Shear strength reliability | As Surface concentration | Suppression of thickening | Comprehensive evaluation |
|---|---|---|---|---|---|---|---|---|---|---|---|---|---|
| | Sn | As | Ag | Cu | Ni | Bi | Sb | Co | In | | | | | |
| Example 1 | Bal. | 0.004 | 1.00 | 0.50 | 0.01 | 1.50 | 5.30 | — | — | ○ | ○ | ○ | ○ | ○ |
| Example 2 | Bal. | 0.004 | 1.00 | 0.50 | 0.01 | 5.50 | 2.00 | — | — | ○ | ○ | ○ | ○ | ○ |
| Example 3 | Bal. | 0.004 | 3.40 | 0.50 | 0.20 | 1.50 | 5.30 | — | — | ○ | ○ | ○ | ○ | ○ |
| Example 4 | Bal. | 0.004 | 3.40 | 0.50 | 0.20 | 5.50 | 2.00 | — | — | ○ | ○ | ○ | ○ | ○ |
| Example 5 | Bal. | 0.004 | 3.40 | 0.50 | 0.04 | 1.50 | 1.00 | — | — | ○ | ○ | ○ | ○ | ○ |
| Example 6 | Bal. | 0.004 | 3.40 | 0.50 | 0.04 | 5.50 | 2.00 | — | — | ○ | ○ | ○ | ○ | ○ |
| Example 7 | Bal. | 0.004 | 3.40 | 0.50 | 0.04 | 1.50 | 5.00 | — | — | ○ | ○ | ○ | ○ | ○ |
| Example 8 | Bal. | 0.004 | 3.40 | 0.50 | 0.04 | 5.00 | 5.30 | — | — | ○ | ○ | ○ | ○ | ○ |
| Example 9 | Bal. | 0.004 | 3.40 | 0.70 | 0.04 | 4.00 | 5.00 | — | — | ○ | ○ | ○ | ○ | ○ |
| Example 10 | Bal. | 0.004 | 3.40 | 0.70 | 0.04 | 4.00 | 4.00 | — | — | ○ | ○ | ○ | ○ | ○ |
| Example 11 | Bal. | 0.004 | 4.00 | 0.70 | 0.04 | 5.00 | 2.00 | — | — | ○ | ○ | ○ | ○ | ○ |
| Example 12 | Bal. | 0.004 | 1.00 | 1.00 | 0.20 | 2.00 | 5.00 | — | — | ○ | ○ | ○ | ○ | ○ |
| Example 13 | Bal. | 0.004 | 3.40 | 0.70 | 0.04 | 1.50 | 1.00 | — | — | ○ | ○ | ○ | ○ | ○ |
| Example 14 | Bal. | 0.004 | 3.40 | 0.70 | 0.04 | 2.50 | 1.00 | — | — | ○ | ○ | ○ | ○ | ○ |
| Example 15 | Bal. | 0.004 | 3.40 | 0.70 | 0.04 | 3.00 | 1.00 | — | — | ○ | ○ | ○ | ○ | ○ |
| Example 16 | Bal. | 0.004 | 3.40 | 0.70 | 0.04 | 3.20 | 1.00 | — | — | ○ | ○ | ○ | ○ | ○ |
| Example 17 | Bal. | 0.004 | 3.40 | 0.70 | 0.04 | 3.50 | 1.00 | — | — | ○ | ○ | ○ | ○ | ○ |
| Example 18 | Bal. | 0.004 | 3.40 | 0.70 | 0.04 | 5.00 | 1.00 | — | — | ○ | ○ | ○ | ○ | ○ |
| Example 19 | Bal. | 0.004 | 3.40 | 0.70 | 0.04 | 5.50 | 2.00 | — | — | ○ | ○ | ○ | ○ | ○ |
| Example 20 | Bal. | 0.004 | 3.40 | 0.70 | 0.04 | 7.00 | 2.00 | — | — | ○ | ○ | ○ | ○ | ○ |
| Example 21 | Bal. | 0.004 | 3.40 | 0.70 | 0.04 | 1.50 | 2.00 | — | — | ○ | ○ | ○ | ○ | ○ |
| Example 22 | Bal. | 0.004 | 3.40 | 0.70 | 0.04 | 3.00 | 2.00 | — | — | ○ | ○ | ○ | ○ | ○ |
| Example 23 | Bal. | 0.004 | 3.40 | 0.70 | 0.04 | 3.20 | 2.00 | — | — | ○ | ○ | ○ | ○ | ○ |
| Example 24 | Bal. | 0.004 | 3.40 | 0.70 | 0.04 | 3.50 | 2.00 | — | — | ○ | ○ | ○ | ○ | ○ |
| Example 25 | Bal. | 0.004 | 3.40 | 0.70 | 0.04 | 5.00 | 2.00 | — | — | ○ | ○ | ○ | ○ | ○ |
| Example 26 | Bal. | 0.004 | 3.40 | 0.70 | 0.04 | 5.50 | 3.00 | — | — | ○ | ○ | ○ | ○ | ○ |
| Example 27 | Bal. | 0.004 | 3.40 | 0.70 | 0.04 | 7.00 | 3.00 | — | — | ○ | ○ | ○ | ○ | ○ |
| Example 28 | Bal. | 0.004 | 3.40 | 0.70 | 0.04 | 1.50 | 3.00 | — | — | ○ | ○ | ○ | ○ | ○ |
| Example 29 | Bal. | 0.004 | 3.40 | 0.70 | 0.04 | 3.00 | 3.00 | — | — | ○ | ○ | ○ | ○ | ○ |
| Example 30 | Bal. | 0.004 | 3.40 | 0.70 | 0.04 | 3.20 | 3.00 | — | — | ○ | ○ | ○ | ○ | ○ |
| Example 31 | Bal. | 0.004 | 3.40 | 0.70 | 0.04 | 3.50 | 3.00 | — | — | ○ | ○ | ○ | ○ | ○ |
| Example 32 | Bal. | 0.004 | 3.40 | 0.70 | 0.04 | 5.00 | 3.00 | — | — | ○ | ○ | ○ | ○ | ○ |
| Example 33 | Bal. | 0.004 | 3.40 | 0.70 | 0.04 | 5.50 | 4.00 | — | — | ○ | ○ | ○ | ○ | ○ |
| Example 34 | Bal. | 0.004 | 3.40 | 0.70 | 0.04 | 7.00 | 4.00 | — | — | ○ | ○ | ○ | ○ | ○ |
| Example 35 | Bal. | 0.004 | 3.40 | 0.70 | 0.04 | 1.50 | 4.00 | — | — | ○ | ○ | ○ | ○ | ○ |
| Example 36 | Bal. | 0.004 | 3.40 | 0.70 | 0.04 | 2.50 | 4.00 | — | — | ○ | ○ | ○ | ○ | ○ |
| Example 37 | Bal. | 0.004 | 3.40 | 0.70 | 0.04 | 3.00 | 4.00 | — | — | ○ | ○ | ○ | ○ | ○ |
| Example 38 | Bal. | 0.004 | 3.40 | 0.70 | 0.04 | 3.20 | 4.00 | — | — | ○ | ○ | ○ | ○ | ○ |
| Example 39 | Bal. | 0.004 | 3.40 | 0.70 | 0.04 | 3.50 | 4.00 | — | — | ○ | ○ | ○ | ○ | ○ |
| Example 40 | Bal. | 0.004 | 3.40 | 0.70 | 0.04 | 5.00 | 4.00 | — | — | ○ | ○ | ○ | ○ | ○ |
| Example 41 | Bal. | 0.004 | 3.40 | 0.70 | 0.04 | 5.50 | 5.00 | — | — | ○ | ○ | ○ | ○ | ○ |
| Example 42 | Bal. | 0.004 | 3.40 | 0.75 | 0.04 | 5.50 | 5.00 | — | — | ○ | ○ | ○ | ○ | ○ |
| Example 43 | Bal. | 0.004 | 3.40 | 0.70 | 0.04 | 1.50 | 5.00 | — | — | ○ | ○ | ○ | ○ | ○ |
| Example 44 | Bal. | 0.004 | 3.40 | 0.70 | 0.04 | 2.00 | 5.00 | — | — | ○ | ○ | ○ | ○ | ○ |
| Example 45 | Bal. | 0.004 | 3.40 | 0.70 | 0.04 | 3.00 | 5.00 | — | — | ○ | ○ | ○ | ○ | ○ |
| Example 46 | Bal. | 0.004 | 3.40 | 0.70 | 0.04 | 3.20 | 5.00 | — | — | ○ | ○ | ○ | ○ | ○ |
| Example 47 | Bal. | 0.004 | 3.40 | 0.70 | 0.04 | 3.50 | 5.00 | — | — | ○ | ○ | ○ | ○ | ○ |
| Example 48 | Bal. | 0.004 | 3.40 | 0.70 | 0.04 | 5.00 | 5.00 | — | — | ○ | ○ | ○ | ○ | ○ |

TABLE 2

| | Alloy composition (mass %) | | | | | | | | Crack reliability | Shear strength reliability | As Surface concentration | Suppression of thickening | Comprehensive evaluation |
|---|---|---|---|---|---|---|---|---|---|---|---|---|---|
| | Sn | As | Ag | Cu | Ni | Bi | Sb | Co | In | | | | | |
| Example 49 | Bal. | 0.004 | 3.40 | 0.70 | 0.04 | 7.00 | 5.30 | — | — | ○ | ○ | ○ | ○ | ○ |
| Example 50 | Bal. | 0.004 | 3.40 | 0.70 | 0.04 | 5.50 | 3.00 | 0.001 | — | ○ | ○ | ○ | ○ | ○ |
| Example 51 | Bal. | 0.004 | 3.40 | 0.70 | 0.04 | 3.20 | 3.00 | 0.008 | — | ○ | ○ | ○ | ○ | ○ |
| Example 52 | Bal. | 0.004 | 3.40 | 0.75 | 0.04 | 3.20 | 3.00 | 0.01 | — | ○ | ○ | ○ | ○ | ○ |
| Example 53 | Bal. | 0.004 | 3.40 | 0.75 | 0.04 | 3.20 | 3.00 | 0.01 | — | ○ | ○ | ○ | ○ | ○ |
| Example 54 | Bal. | 0.004 | 3.40 | 0.70 | 0.04 | 3.20 | 3.00 | 0.1 | — | ○ | ○ | ○ | ○ | ○ |
| Example 55 | Bal. | 0.004 | 3.40 | 0.70 | 0.04 | 5.00 | 5.00 | — | 0.1 | ○ | ○ | ○ | ○ | ○ |
| Example 56 | Bal. | 0.004 | 3.40 | 0.70 | 0.04 | 5.00 | 5.00 | 0.01 | 0.2 | ○ | ○ | ○ | ○ | ○ |

TABLE 2-continued

| | Alloy composition (mass %) | | | | | | | | Crack reliability | Shear strength reliability | As Surface concentration | Suppression of thickening | Comprehensive evaluation |
|---|---|---|---|---|---|---|---|---|---|---|---|---|---|
| | Sn | As | Ag | Cu | Ni | Bi | Sb | Co | In | | | | | |
| Example 57 | Bal. | 0.004 | 3.40 | 0.70 | 0.04 | 5.00 | 5.00 | — | — | ○ | ○ | ○ | ○ | ○ |
| Example 58 | Bal. | 0.004 | 3.40 | 0.70 | 0.04 | 5.00 | 5.00 | 0.01 | — | ○ | ○ | ○ | ○ | ○ |
| Example 59 | Bal. | 0.004 | 3.40 | 0.70 | 0.04 | 7.00 | 5.00 | — | — | ○ | ○ | ○ | ○ | ○ |
| Example 60 | Bal. | 0.004 | 3.40 | 0.70 | 0.04 | 7.00 | 2.00 | — | — | ○ | ○ | ○ | ○ | ○ |
| Example 61 | Bal. | 0.004 | 3.40 | 0.70 | 0.04 | 7.00 | 3.00 | — | — | ○ | ○ | ○ | ○ | ○ |
| Example 62 | Bal. | 0.004 | 3.40 | 0.70 | 0.04 | 7.00 | 4.00 | — | — | ○ | ○ | ○ | ○ | ○ |
| Example 63 | Bal. | 0.004 | 3.40 | 0.70 | 0.04 | 5.00 | 5.00 | 0.008 | — | ○ | ○ | ○ | ○ | ○ |
| Example 64 | Bal. | 0.004 | 3.40 | 0.75 | 0.04 | 5.00 | 5.00 | 0.008 | — | ○ | ○ | ○ | ○ | ○ |
| Example 65 | Bal. | 0.004 | 3.40 | 0.50 | 0.04 | 5.00 | 5.00 | 0.008 | — | ○ | ○ | ○ | ○ | ○ |
| Example 66 | Bal. | 0.004 | 3.40 | 0.70 | 0.04 | 5.00 | 1.60 | 0.008 | — | ○ | ○ | ○ | ○ | ○ |
| Example 67 | Bal. | 0.004 | 3.40 | 0.70 | 0.04 | 5.00 | 5.30 | 0.008 | — | ○ | ○ | ○ | ○ | ○ |
| Example 68 | Bal. | 0.004 | 3.40 | 0.70 | 0.04 | 4.90 | 5.00 | 0.008 | — | ○ | ○ | ○ | ○ | ○ |
| Example 69 | Bal. | 0.004 | 3.40 | 0.70 | 0.04 | 5.50 | 5.00 | 0.008 | — | ○ | ○ | ○ | ○ | ○ |
| Example 70 | Bal. | 0.004 | 3.40 | 0.70 | 0.01 | 5.00 | 5.00 | 0.008 | — | ○ | ○ | ○ | ○ | ○ |
| Example 71 | Bal. | 0.004 | 3.40 | 0.70 | 0.09 | 5.00 | 5.00 | 0.008 | — | ○ | ○ | ○ | ○ | ○ |
| Example 72 | Bal. | 0.004 | 3.40 | 0.70 | 0.04 | 5.00 | 5.00 | 0.002 | — | ○ | ○ | ○ | ○ | ○ |
| Example 73 | Bal. | 0.004 | 3.40 | 0.70 | 0.04 | 5.00 | 5.00 | 0.100 | — | ○ | ○ | ○ | ○ | ○ |
| Example 74 | Bal. | 0.004 | 3.40 | 0.70 | 0.04 | 5.50 | 2.00 | 0.010 | — | ○ | ○ | ○ | ○ | ○ |
| Example 75 | Bal. | 0.004 | 3.40 | 0.70 | 0.04 | 5.50 | 5.30 | 0.010 | — | ○ | ○ | ○ | ○ | ○ |
| Example 76 | Bal. | 0.004 | 3.40 | 0.75 | 0.04 | 5.50 | 5.30 | 0.010 | — | ○ | ○ | ○ | ○ | ○ |
| Example 77 | Bal. | 0.004 | 3.40 | 0.70 | 0.04 | 7.00 | 2.00 | 0.010 | — | ○ | ○ | ○ | ○ | ○ |
| Example 78 | Bal. | 0.004 | 3.40 | 0.70 | 0.04 | 7.00 | 5.30 | 0.010 | — | ○ | ○ | ○ | ○ | ○ |
| Example 79 | Bal. | 0.004 | 3.50 | 0.70 | 0.10 | 5.00 | 5.00 | 0.005 | — | ○ | ○ | ○ | ○ | ○ |
| Example 80 | Bal. | 0.004 | 3.40 | 0.70 | 0.04 | 1.50 | 2.00 | 0.008 | — | ○ | ○ | ○ | ○ | ○ |
| Example 81 | Bal. | 0.008 | 1.00 | 0.50 | 0.01 | 1.50 | 5.30 | — | — | ○ | ○ | ○ | ○ | ○ |
| Example 82 | Bal. | 0.008 | 1.00 | 0.50 | 0.01 | 5.50 | 2.00 | — | — | ○ | ○ | ○ | ○ | ○ |
| Example 83 | Bal. | 0.008 | 3.40 | 0.70 | 0.04 | 3.00 | 3.00 | — | — | ○ | ○ | ○ | ○ | ○ |
| Example 84 | Bal. | 0.008 | 3.40 | 0.70 | 0.04 | 5.00 | 3.00 | — | — | ○ | ○ | ○ | ○ | ○ |
| Example 85 | Bal. | 0.008 | 3.40 | 0.70 | 0.04 | 3.50 | 5.00 | — | — | ○ | ○ | ○ | ○ | ○ |
| Example 86 | Bal. | 0.008 | 3.40 | 0.70 | 0.04 | 5.00 | 5.00 | — | — | ○ | ○ | ○ | ○ | ○ |
| Example 87 | Bal. | 0.008 | 3.40 | 0.70 | 0.04 | 7.00 | 5.30 | — | — | ○ | ○ | ○ | ○ | ○ |
| Example 88 | Bal. | 0.008 | 3.40 | 0.70 | 0.04 | 5.50 | 3.00 | 0.001 | — | ○ | ○ | ○ | ○ | ○ |
| Example 89 | Bal. | 0.008 | 3.40 | 0.70 | 0.04 | 3.20 | 3.00 | 0.008 | — | ○ | ○ | ○ | ○ | ○ |
| Example 90 | Bal. | 0.008 | 3.40 | 0.70 | 0.04 | 3.20 | 3.00 | 0.01 | — | ○ | ○ | ○ | ○ | ○ |
| Example 91 | Bal. | 0.008 | 3.40 | 0.70 | 0.04 | 3.20 | 3.00 | 0.1 | — | ○ | ○ | ○ | ○ | ○ |
| Example 92 | Bal. | 0.008 | 3.40 | 0.70 | 0.04 | 5.00 | 5.00 | 0.100 | — | ○ | ○ | ○ | ○ | ○ |
| Example 93 | Bal. | 0.008 | 3.40 | 0.70 | 0.04 | 5.50 | 2.00 | 0.010 | — | ○ | ○ | ○ | ○ | ○ |
| Example 94 | Bal. | 0.008 | 3.40 | 0.70 | 0.04 | 5.50 | 5.30 | 0.010 | — | ○ | ○ | ○ | ○ | ○ |
| Example 95 | Bal. | 0.008 | 3.40 | 0.70 | 0.04 | 7.00 | 2.00 | 0.010 | — | ○ | ○ | ○ | ○ | ○ |
| Example 96 | Bal. | 0.008 | 3.40 | 0.70 | 0.04 | 7.00 | 5.30 | 0.010 | — | ○ | ○ | ○ | ○ | ○ |

TABLE 3

| | Alloy composition (mass %) | | | | | | | | Crack reliability | Shear strength reliability | As Surface concentration | Suppression of thickening | Comprehensive evaluation |
|---|---|---|---|---|---|---|---|---|---|---|---|---|---|
| | Sn | As | Ag | Cu | Ni | Bi | Sb | Co | In | | | | | |
| Example 97 | Bal. | 0.015 | 1.00 | 0.50 | 0.01 | 1.50 | 5.30 | — | — | ○ | ○ | ○ | ○ | ○ |
| Example 98 | Bal. | 0.015 | 1.00 | 0.50 | 0.01 | 5.50 | 2.00 | — | — | ○ | ○ | ○ | ○ | ○ |
| Example 99 | Bal. | 0.015 | 3.40 | 0.70 | 0.04 | 3.00 | 3.00 | — | — | ○ | ○ | ○ | ○ | ○ |
| Example 100 | Bal. | 0.015 | 3.40 | 0.70 | 0.04 | 5.00 | 3.00 | — | — | ○ | ○ | ○ | ○ | ○ |
| Example 101 | Bal. | 0.015 | 3.40 | 0.70 | 0.04 | 3.50 | 5.00 | — | — | ○ | ○ | ○ | ○ | ○ |
| Example 102 | Bal. | 0.015 | 3.40 | 0.70 | 0.04 | 5.00 | 5.00 | — | — | ○ | ○ | ○ | ○ | ○ |
| Example 103 | Bal. | 0.015 | 3.40 | 0.70 | 0.04 | 7.00 | 5.30 | — | — | ○ | ○ | ○ | ○ | ○ |
| Example 104 | Bal. | 0.015 | 3.40 | 0.70 | 0.04 | 5.50 | 3.00 | 0.001 | — | ○ | ○ | ○ | ○ | ○ |
| Example 105 | Bal. | 0.015 | 3.40 | 0.70 | 0.04 | 3.20 | 3.00 | 0.008 | — | ○ | ○ | ○ | ○ | ○ |
| Example 106 | Bal. | 0.015 | 3.40 | 0.70 | 0.04 | 3.20 | 3.00 | 0.01 | — | ○ | ○ | ○ | ○ | ○ |
| Example 107 | Bal. | 0.015 | 3.40 | 0.70 | 0.04 | 3.20 | 3.00 | 0.1 | — | ○ | ○ | ○ | ○ | ○ |
| Example 108 | Bal. | 0.015 | 3.40 | 0.70 | 0.04 | 5.00 | 5.00 | 0.100 | — | ○ | ○ | ○ | ○ | ○ |
| Example 109 | Bal. | 0.015 | 3.40 | 0.70 | 0.04 | 5.50 | 2.00 | 0.010 | — | ○ | ○ | ○ | ○ | ○ |
| Example 110 | Bal. | 0.015 | 3.40 | 0.70 | 0.04 | 5.50 | 5.30 | 0.010 | — | ○ | ○ | ○ | ○ | ○ |
| Example 111 | Bal. | 0.015 | 3.40 | 0.70 | 0.04 | 7.00 | 2.00 | 0.010 | — | ○ | ○ | ○ | ○ | ○ |
| Example 112 | Bal. | 0.015 | 3.40 | 0.70 | 0.04 | 7.00 | 5.30 | 0.010 | — | ○ | ○ | ○ | ○ | ○ |
| Example 113 | Bal. | 0.025 | 1.00 | 0.50 | 0.01 | 1.50 | 5.30 | — | — | ○ | ○ | ○ | ○ | ○ |
| Example 114 | Bal. | 0.025 | 1.00 | 0.50 | 0.01 | 5.50 | 2.00 | — | — | ○ | ○ | ○ | ○ | ○ |
| Example 115 | Bal. | 0.025 | 3.40 | 0.70 | 0.04 | 3.00 | 3.00 | — | — | ○ | ○ | ○ | ○ | ○ |
| Example 116 | Bal. | 0.025 | 3.40 | 0.70 | 0.04 | 5.00 | 3.00 | — | — | ○ | ○ | ○ | ○ | ○ |
| Example 117 | Bal. | 0.025 | 3.40 | 0.70 | 0.04 | 3.50 | 5.00 | — | — | ○ | ○ | ○ | ○ | ○ |
| Example 118 | Bal. | 0.025 | 3.40 | 0.70 | 0.04 | 5.00 | 5.00 | — | — | ○ | ○ | ○ | ○ | ○ |
| Example 119 | Bal. | 0.025 | 3.40 | 0.70 | 0.04 | 7.00 | 5.30 | — | — | ○ | ○ | ○ | ○ | ○ |
| Example 120 | Bal. | 0.025 | 3.40 | 0.70 | 0.04 | 5.50 | 3.00 | 0.001 | — | ○ | ○ | ○ | ○ | ○ |

TABLE 3-continued

| | Alloy composition (mass %) | | | | | | | | Crack reliability | Shear strength reliability | As Surface concentration | Suppression of thickening | Comprehensive evaluation |
|---|---|---|---|---|---|---|---|---|---|---|---|---|---|
| | Sn | As | Ag | Cu | Ni | Bi | Sb | Co | In | | | | | |
| Example 121 | Bal. | 0.025 | 3.40 | 0.70 | 0.04 | 3.20 | 3.00 | 0.008 | — | ○ | ○ | ○ | ○ | ○ |
| Example 122 | Bal. | 0.025 | 3.40 | 0.70 | 0.04 | 3.20 | 3.00 | 0.01 | — | ○ | ○ | ○ | ○ | ○ |
| Example 123 | Bal. | 0.025 | 3.40 | 0.70 | 0.04 | 3.20 | 3.00 | 0.1 | — | ○ | ○ | ○ | ○ | ○ |
| Example 124 | Bal. | 0.025 | 3.40 | 0.70 | 0.04 | 5.00 | 5.00 | 0.100 | — | ○ | ○ | ○ | ○ | ○ |
| Example 125 | Bal. | 0.025 | 3.40 | 0.70 | 0.04 | 5.50 | 2.00 | 0.010 | — | ○ | ○ | ○ | ○ | ○ |
| Example 126 | Bal. | 0.025 | 3.40 | 0.70 | 0.04 | 5.50 | 5.30 | 0.010 | — | ○ | ○ | ○ | ○ | ○ |
| Example 127 | Bal. | 0.025 | 3.40 | 0.70 | 0.04 | 7.00 | 2.00 | 0.010 | — | ○ | ○ | ○ | ○ | ○ |
| Example 128 | Bal. | 0.025 | 3.40 | 0.70 | 0.04 | 7.00 | 5.30 | 0.010 | — | ○ | ○ | ○ | ○ | ○ |
| Comparative Example 1 | Bal. | 0.004 | 0.90 | 0.40 | 0.009 | — | 0.90 | — | — | X | X | ○ | ○ | X |
| Comparative Example 2 | Bal. | 0.004 | 3.40 | 0.70 | 0.04 | — | — | — | — | X | X | ○ | ○ | X |
| Comparative Example 3 | Bal. | 0.004 | 3.40 | 0.70 | 0.04 | 1.50 | — | — | — | X | X | ○ | ○ | X |
| Comparative Example 4 | Bal. | 0.004 | 3.40 | 0.70 | 0.04 | 3.00 | — | — | — | X | X | ○ | ○ | X |
| Comparative Example 5 | Bal. | 0.004 | 3.40 | 0.70 | 0.04 | 3.20 | — | — | — | X | X | ○ | ○ | X |
| Comparative Example 6 | Bal. | 0.004 | 3.40 | 0.70 | 0.04 | 3.50 | — | — | — | X | X | ○ | ○ | X |
| Comparative Example 7 | Bal. | 0.004 | 3.40 | 0.70 | 0.04 | 5.00 | — | — | — | X | X | ○ | ○ | X |
| Comparative Example 8 | Bal. | 0.004 | 3.40 | 0.70 | 0.04 | 5.50 | — | — | — | X | X | ○ | ○ | X |
| Comparative Example 9 | Bal. | 0.004 | 3.40 | 0.70 | 0.04 | 7.00 | — | — | — | X | X | ○ | ○ | X |
| Comparative Example 10 | Bal. | 0.004 | 3.40 | 0.70 | 0.04 | — | 0.50 | — | — | X | X | ○ | ○ | X |
| Comparative Example 11 | Bal. | 0.004 | 3.40 | 0.70 | 0.04 | 7.00 | 1.00 | — | — | ○ | X | ○ | ○ | X |
| Comparative Example 12 | Bal. | 0.004 | 3.40 | 0.70 | 0.04 | — | 7.00 | — | — | X | X | ○ | ○ | X |
| Comparative Example 13 | Bal. | 0.004 | 3.40 | 0.70 | 0.04 | 1.50 | 7.00 | — | — | X | X | ○ | ○ | X |
| Comparative Example 14 | Bal. | 0.004 | 3.40 | 0.70 | 0.04 | 3.00 | 7.00 | — | — | ○ | X | ○ | ○ | X |
| Comparative Example 15 | Bal. | 0.004 | 3.40 | 0.70 | 0.04 | 3.20 | 7.00 | — | — | ○ | X | ○ | ○ | X |
| Comparative Example 16 | Bal. | 0.004 | 3.40 | 0.70 | 0.04 | 3.50 | 7.00 | — | — | ○ | X | ○ | ○ | X |

TABLE 4

| | Alloy composition (mass %) | | | | | | | | Crack reliability | Shear strength reliability | As Surface concentration | Suppression of thickening | Comprehensive evaluation |
|---|---|---|---|---|---|---|---|---|---|---|---|---|---|
| | Sn | As | Ag | Cu | Ni | Bi | Sb | Co | In | | | | | |
| Comparative Example 17 | Bal. | 0.004 | 3.40 | 0.70 | 0.04 | 5.00 | <u>7.00</u> | — | — | ○ | X | ○ | ○ | X |
| Comparative Example 18 | Bal. | 0.004 | 3.40 | 0.70 | 0.04 | 5.50 | <u>7.00</u> | — | — | ○ | X | ○ | ○ | X |
| Comparative Example 19 | Bal. | 0.004 | 3.40 | 0.70 | 0.04 | 7.00 | <u>7.00</u> | — | — | ○ | X | ○ | ○ | X |
| Comparative Example 20 | Bal. | 0.004 | 3.40 | 0.70 | 0.04 | — | 1.00 | 0.15 | — | X | X | ○ | ○ | X |
| Comparative Example 21 | Bal. | 0.004 | 3.40 | <u>1.10</u> | <u>0.30</u> | — | <u>8.00</u> | — | — | X | X | ○ | ○ | X |
| Comparative Example 22 | Bal. | — | 1.00 | 0.50 | 0.01 | — | 5.00 | — | — | ○ | ○ | X | X | X |
| Comparative Example 23 | Bal. | <u>0.05</u> | 1.00 | 0.50 | 0.01 | — | 5.00 | — | — | — | — | ○ | ○ | X |
| Comparative Example 24 | Bal. | 0.004 | 3.40 | 0.70 | — | 5.00 | 5.00 | 0.008 | — | X | X | ○ | ○ | X |
| Comparative Example 25 | Bal. | 0.004 | 3.40 | 0.50 | 0.04 | 1.50 | 1.00 | — | — | ○ | ○ | X | X | X |

The underlines indicate that the numerical values are out of the ranges of the present invention.

TABLE 5

| Flux material | Formulation ratio (mass %) |
| --- | --- |
| Rosin | 42 |
| Glycol-based solvent | 35 |
| Thixotropic agent | 8 |
| Organic acid | 10 |
| Amine | 2 |
| Halogen | 3 |
| Total | 100 |

As shown in Tables 1 to 4, it was found that since Examples 1 to 128 satisfied all of the requirements of the present invention with all of the alloy compositions, the examples had excellent crack reliability and shear strength reliability and had an As-concentrated layer and a thickening suppression effect. In addition, it was not only found that all of the examples included an As-concentrated layer and the change in viscosity of a solder paste over time was suppressed in the examples, but it was also found that yellowish discoloration during heating solder pieces was suppressed. On the other hand, since Comparative Examples 1 to 24 did not satisfy at least one of the requirements of the present invention with all of the alloy compositions, it was found that at least one of the above-described effects deteriorated. In Comparative Example 23, since a solder joint could not be formed due to a large amount of As and deteriorated wettability, the crack reliability and the shear strength reliability could not be evaluated. In Comparative Example 25, since no heat treatment was performed, no As-concentrated layer was formed. Therefore, the thickening suppression effect could not be obtained.

REFERENCE SIGNS LIST

1 Chip component
2 Solder alloy
3 Board
4 Cu land
5 Intermetallic compound layer
6 Crack development path
8 Expected crack development path

The invention claimed is:

1. A solder alloy containing, by mass %, 1% to 4% of Ag, 0.5% to 1.0% of Cu, 1.5% to 5.5% of Bi, 1.0% to 5.3% of Sb 0.01% to 0.2% of Ni, 0.0040% to 0.0250% of As, and a balance of Sn,
wherein, the solder alloy comprises an As-concentrated layer,
wherein the presence of the As-concentrated layer is confirmed by determination criteria below,
wherein the As-concentrated layer is a region from an outermost surface of the solder alloy to a depth of 2×D1 (nm) calculated from sputtering time using an ion sputter-etching rate of a $SiO_2$ standard sample, and
wherein a thickness of the As-concentrated layer is 0.5 to 8.0 nm;
wherein the determination criteria comprises:
In a sample having a size of 5.0 mm×5.0 mm, an arbitrary area of 700 μm×300 μm is selected, and XPS analysis is performed in combination with ion sputtering; One area is selected for each sample, and each of three samples is analyzed once, for a total of three analyses;
In a case where S1>S2 in all of the three analyses, it is determined that an As-concentrated layer has been formed;
wherein the definition of S1, S2, and D1 is as follows,
S1: Integrated value of a detection intensity of As in a region from a depth of 0 to 2×D1 (nm) calculated from sputtering time using an ion sputter-etching rate of a $SiO_2$ standard sample in a chart of XPS analysis
S2: Integrated value of a detection intensity of As in a region from a depth of 2×D1 to 4×D1 (nm) calculated from sputtering time using an ion sputter-etching rate of a $SiO_2$ standard sample in a chart of XPS analysis
D1: Initial depth (nm) calculated from sputtering time using an ion sputter-etching rate of a $SiO_2$ standard sample at which a detection intensity of O atoms is ½ a maximum detection intensity (intensity at Do·max) in a portion deeper than the depth (Do·max (nm)) calculated from sputtering time using an ion sputter-etching rate of a $SiO_2$ standard sample at which a detection intensity of O atoms is a maximum.

2. The solder alloy according to claim 1 further containing less than or equal to 0.2% of In by mass %.

3. The solder alloy according to claim 1 further containing less than or equal to 0.1% of Co by mass %.

4. The A solder paste comprising:
a solder powder formed of the solder alloy according to claim 1; and
a flux.

5. The A solder ball formed of the solder alloy according to claim 1.

6. The A solder preform formed of the solder alloy according to claim 1.

7. The A solder joint made of the solder alloy according to claim 1.

8. The An on-board electronic circuit comprising:
the solder alloy according to claim 1.

9. The An ECU electronic circuit comprising:
the solder alloy according to claim 1.

10. The An on-board electronic circuit device comprising:
the on-board electronic circuit according to claim 8.

11. The An ECU electronic circuit device comprising:
the ECU electronic circuit according to claim 9.

12. The solder alloy according to claim 2 further containing less than or equal to 0.1% of Co by mass %.

13. A solder alloy containing, by mass %, 1% to 4% of Ag, 0.5% to 1.0% of Cu, greater than 5.5% and less than or equal to 7.0% of Bi, 2.0% to 5.3% of Sb, 0.01% to 0.2% of Ni, 0.0040% to 0.0250% of As, and a balance of Sn,
wherein, the solder alloy comprises an As-concentrated layer,
wherein the presence of the As-concentrated layer is confirmed by determination criteria below,
wherein the As-concentrated layer is a region from an outermost surface of the solder alloy to a depth of 2×D1 (nm) calculated from sputtering time using an ion sputter-etching rate of a $SiO_2$ standard sample, and
wherein a thickness of the As-concentrated layer is 0.5 to 8.0 nm;
wherein the determination criteria comprises:
In a sample having a size of 5.0 mm×5.0 mm, an arbitrary area of 700 μm×300 μm is selected, and XPS analysis is performed in combination with ion sputtering; One area is selected for each sample, and each of three samples is analyzed once, for a total of three analyses;
In a case where S1>S2 in all of the three analyses, it is determined that an As-concentrated layer has been formed,
wherein the definition of S1, S2, and D1 is as follows,
S1: Integrated value of a detection intensity of As in a region from a depth of 0 to 2×D1 (nm) calculated from sputtering time using an ion sputter-etching rate of a SiO$_2$ standard sample in a chart of XPS analysis S2: Integrated value of a detection intensity of As in a region from a depth of 2×D1 to 4×D1 (nm) calculated from sputtering time using an ion sputter-etching rate of a SiO$_2$ standard sample in a chart of XPS analysis D1: Initial depth (nm) calculated from sputtering time using an ion sputter-etching rate of a SiO$_2$ standard sample at which a detection intensity of O atoms is ½ a maximum detection intensity (intensity at Do·max) in a portion deeper than the depth (Do·max (nm)) calculated from sputtering time using an ion sputter-etching rate of a SiO$_2$ standard sample at which a detection intensity of O atoms is a maximum.

* * * * *